US009660588B1

United States Patent
Wu

(10) Patent No.: US 9,660,588 B1
(45) Date of Patent: May 23, 2017

(54) QUATERNARY/TERNARY MODULATION SELECTING CIRCUIT AND ASSOCIATED METHOD

(71) Applicant: Elite Semiconductor Memory Technology Inc., Hsinchu (TW)

(72) Inventor: Shuen-Ta Wu, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 14/986,737

(22) Filed: Jan. 4, 2016

(51) Int. Cl.
*H03F 3/38* (2006.01)
*H03F 1/02* (2006.01)
*H03F 3/183* (2006.01)
*H03F 3/217* (2006.01)

(52) U.S. Cl.
CPC ............ *H03F 1/0205* (2013.01); *H03F 3/183* (2013.01); *H03F 3/217* (2013.01); *H03F 2200/03* (2013.01); *H03F 2200/351* (2013.01)

(58) Field of Classification Search
CPC ............. H03F 3/217; H03F 3/38; H03F 3/387
USPC ...................................... 330/10, 207 A, 251
See application file for complete search history.

(56) References Cited

U.S. PATENT DOCUMENTS

| 5,077,539 A | * | 12/1991 | Howatt | ................. | H03F 1/0277 323/283 |
| 6,262,632 B1 | | 7/2001 | Corsi | | |
| 6,614,297 B2 | * | 9/2003 | Score | ...................... | H03F 3/217 330/10 |
| 7,339,425 B2 | | 3/2008 | Yang | | |
| 2016/0268984 A1 | * | 9/2016 | Wu | ........................ | H03F 3/183 |

FOREIGN PATENT DOCUMENTS

TW 200814516 3/2008
TW 201143274 A1 12/2011

\* cited by examiner

*Primary Examiner* — Steven J Mottola
(74) *Attorney, Agent, or Firm* — Winston Hsu; Scott Margo

(57) ABSTRACT

A quaternary/ternary modulation selecting circuit of an audio amplifier includes a quaternary signal generating circuit, for receiving complementary analog input signals to generate complementary quaternary signals; and a ternary signal generating circuit for generating a ternary signal according to the complementary quaternary signals, wherein the ternary signal includes a positive ternary wave and a negative ternary wave; wherein when a difference in amplitude between the complementary analog input signals is within a predetermined range of zero amplitude, a signal pattern of the positive ternary wave generated from the ternary signal generating circuit is identical to a signal pattern of the negative ternary wave generated from the ternary signal generating circuit.

20 Claims, 9 Drawing Sheets

QUATERNARY/TERNARY MODULATION SELECTING CIRCUIT AND ASSOCIATED METHOD

BACKGROUND OF THE INVENTION

1. Field of the Invention

The present invention relates to an audio amplifier, and more particularly, to a quaternary/ternary modulation selecting circuit of an audio amplifier and an associated method.

2. Description of the Prior Art

An analog amplifier is one of the most important parts in an audio system. Efficiency is a critical issue; a class D power amplifier is the most popular kind due to its higher efficiency compared to other kinds of amplifier. Because the output waveform of the class D power amplifier is a modulation signal between two voltage levels (i.e. supply voltage and ground) rather than a common linear waveform, ideally no current will pass through when the transistors of the output stage are non-conductive. A common modulation method applied in the class D power amplifier is Pulse Width Modulation (PWM), wherein quaternary modulation has the advantages of better total harmonic distortion (THD) and lower noise floor and is better for operating under small power conditions; and ternary modulation has the advantages of better efficiency and better Electro Magnetic Interference (EMI) performance and is better for operating under large power conditions. A quaternary/ternary modulation selecting circuit which can combine the above advantages is therefore a popular architecture. Pulses with extremely short duty cycle which cannot be detected by the circuit but still cause power loss will show at the output terminal when there is no input signal or a very small input signal for the amplifier. Therefore, it is desirable to develop a novel quaternary/ternary modulation selecting circuit design which can solve the power dissipation and distortion when there is no input signal for the amplifier.

SUMMARY OF THE INVENTION

One of the objectives of the present invention is to provide a quaternary/ternary modulation selecting circuit of an audio amplifier and an associated method.

According to an embodiment of the present invention, a quaternary/ternary modulation selecting circuit of an audio amplifier is disclosed, wherein the quaternary/ternary modulation selecting circuit comprises: a quaternary signal generating circuit for receiving complementary analog input signals to generate complementary quaternary signals; a ternary signal generating circuit, for generating a ternary signal according to the complementary quaternary signals, wherein the ternary signal comprises a positive ternary wave and a negative ternary wave; wherein when a difference in amplitude between the complementary analog input signals is within a predetermined range of zero amplitude, a signal pattern of the positive ternary wave generated from the ternary signal generating circuit is identical to a signal pattern of the negative ternary wave generated from the ternary signal generating circuit.

According to an embodiment of the present invention, a quaternary/ternary modulation selecting method of an audio amplifier is disclosed, wherein the method comprises: receiving complementary analog input signals to generate complementary quaternary signals; generating a ternary signal according to the complementary quaternary signals, wherein the ternary signal comprises a positive ternary wave and a negative ternary wave; wherein when a difference in amplitude between the complementary analog input signals is within a predetermined range of zero amplitude, a signal pattern of the positive ternary wave is identical to a signal pattern of the negative ternary wave.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
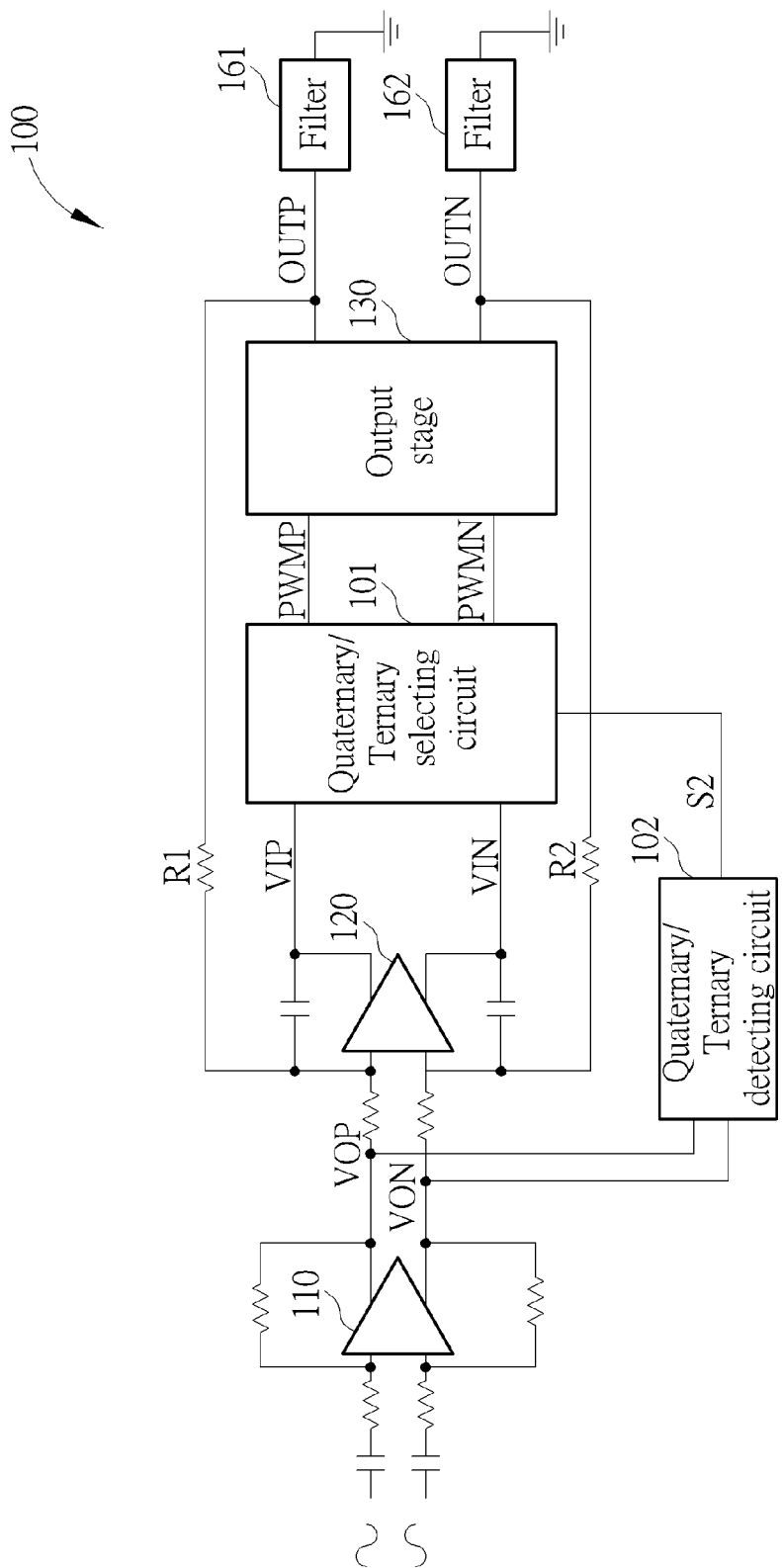
FIG. 1 is a diagram illustrating an audio amplifier with a quaternary/ternary modulation selecting circuit according to an embodiment of the present invention.

FIG. 1 is a diagram illustrating an audio amplifier 100 with a quaternary/ternary modulation selecting circuit 101 according to an embodiment of the present invention. In this embodiment, the audio amplifier 100 is a class D power amplifier, and the audio amplifier 100 comprises a gain stage 110, an integrator 120, the quaternary/ternary modulation selecting circuit 101, a quaternary/ternary detecting circuit 102, an output stage 130, two feedback resistors R1 and R2, and two filters 161 and 162. The quaternary/ternary modulation selecting circuit 101 is arranged to select one of the quaternary signal, the ternary signal and at least one pulse with a limited duty cycle, and the quaternary/ternary detecting circuit 102 is arranged to detect the output signals $V_{op}/V_{ON}$ of the gain stage 110 and send a signal S2 to the quaternary/ternary modulation selecting circuit 101 according to the output signals $V_{op}/V_{ON}$ of the gain stage 110 to decide which signal should be outputted to the output stage 130 by the quaternary/ternary modulation selecting circuit 101. The other components are similar to corresponding parts of a traditional class D power amplifier; as their function should be well-known to a person skilled in the art, a detailed description is omitted here for brevity.

Figure 2:
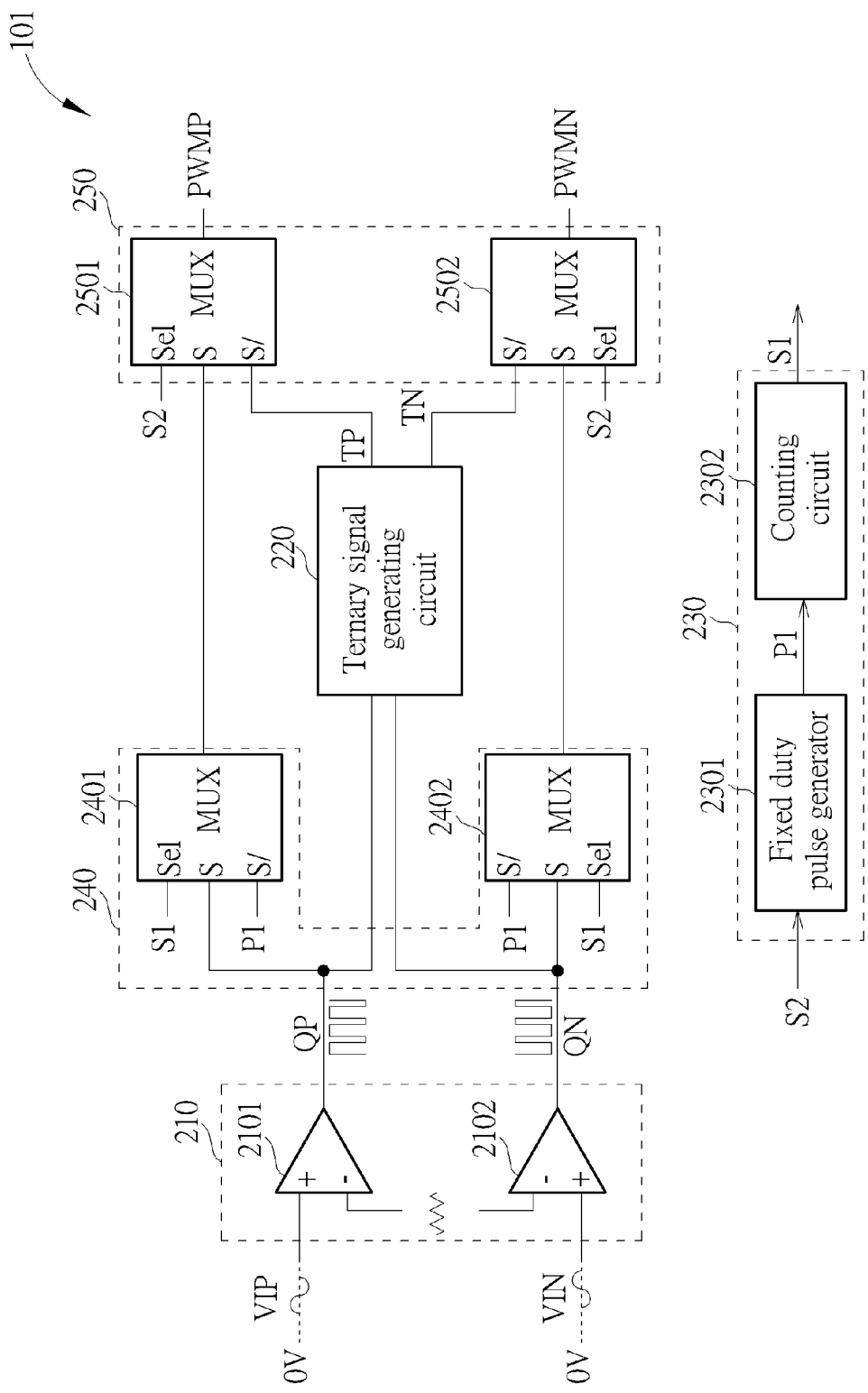
FIG. 2 is a diagram illustrating the quaternary/ternary modulation selecting circuit according to an embodiment of the present invention.

FIG. 2 is a diagram illustrating the quaternary/ternary modulation selecting circuit 101 according to an embodiment of the present invention. As shown in FIG. 2, the quaternary/ternary modulation selecting circuit 101 comprises a quaternary signal generating circuit 210, a ternary signal generating circuit 220 and a pulse generating circuit 230. The quaternary signal generating circuit 210 receives complementary analog input signals VIP and VIN. The quaternary signal generating circuit 210 is coupled to the integrator 120 shown in FIG. 1 and comprises two comparators 2101 and 2102 for comparing the output signals of the integrator 120 shown in FIG. 1 with a triangular wave to generate a quaternary signal, wherein the quaternary signal comprises a positive quaternary wave QP and a negative wave QN and the positive and negative quaternary waves QP and QN are complementary to each other. The ternary signal generating circuit 220 is coupled to the quaternary signal generating circuit 210 for generating a ternary signal according to the positive quaternary wave QP and the negative quaternary wave QN, wherein the ternary signal comprises a positive ternary wave TP and a negative ternary wave TN. The pulse generating circuit 230 comprises a fixed duty pulse generator 2301 and a counting circuit 2302, wherein the fixed duty pulse generator 2301 is arranged for generating a signal P1 comprising two pulses with a 25% duty cycle according to the signal S2 to suppress the inrush current which will be discussed later, and the counting circuit 2302 is arranged for receiving the signal P1 comprising the two pulses with 25% duty cycle then sending a signal S1. The detailed description of the pulse generating circuit 230 will be discussed in the following paragraphs.

The inrush current mentioned above usually occurs in the initial successive pulses when the mode of the quaternary/ternary modulation selecting circuit 101 changes to the quaternary modulation from the ternary modulation and when the audio amplifier 100 starts up. Therefore, in this embodiment, the plurality of pulses with fixed duty cycle are two pulses with 25% duty cycles inserted before the quaternary signal is introduced when the audio amplifier 100 starts up or goes into quaternary modulation from ternary modulation to suppress the inrush current.

The quaternary/ternary modulation selecting circuit 101 further comprises a first selecting circuit 240 and a second selecting circuit 250, wherein the first selecting circuit 240 comprises multiplexers 2401 and 2402 for selecting one of the signal P1 comprising two pulses with 25% duty cycles and the quaternary signal according to the signal S1 sent by the counting circuit 2302 of the pulse generating circuit 230, and the second selecting circuit 250 comprises multiplexers 2501 and 2502 for selecting one of the signal selected by the first selecting circuit 240 (i.e. the signal P1 or the quaternary signal) and the ternary signal to the output stage 130 of the amplifier 100 according to the signal S2.

Figure 3:
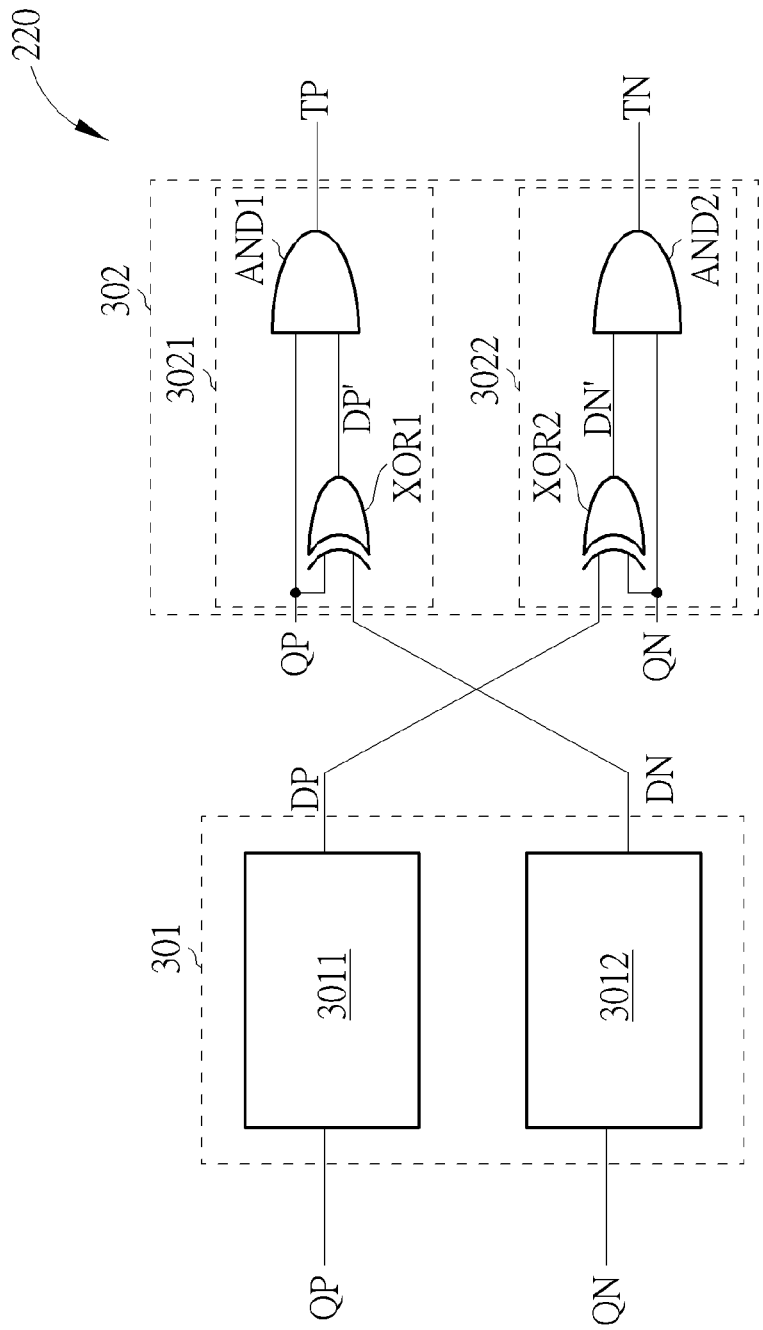
FIG. 3 is a diagram illustrating a ternary signal generating circuit according to an embodiment of the present invention.

FIG. 3 is a diagram illustrating the ternary signal generating circuit 220 according to an embodiment of the present invention. As shown in FIG. 3, the ternary signal generating circuit 220 comprises a delay circuit 301 and a generating unit 302, wherein the delay circuit 301 comprises a first delay unit 3011 and a second delay unit 3012 for delaying the positive quaternary wave QP and the negative quaternary wave QN to generate a delayed signal DP and a delayed signal DN, respectively, and the generating unit 302 comprises a first generating unit 3021 for generating the positive ternary wave TP according to the delayed signal DN and the positive quaternary wave QP, and a second generating unit 3022 for generating the negative ternary wave TN according to the delayed signal DP and the negative ternary wave QN. In this embodiment, as shown in FIG. 3, the first generating unit 3021 may be implemented by an XOR gate XOR1 and an AND gate AND1 in which the XOR gate XOR1 receives the delayed signal DN and the positive quaternary wave QP to generate a signal DP', and the AND gate AND1 receives the signal DP' and the positive quaternary wave QP to generate the positive ternary wave TP. Similarly, the second generating unit 3022 may be implemented by an XOR gate XOR2 and an AND gate AND2 in which the XOR gate XOR2 receives the delayed signal DP and the negative quaternary wave QN to generate a signal DN' and the AND gate AND2 receives the signal DN' and the negative quaternary wave QN to generate the negative ternary wave TN. It should be noted that the implementation of the first generating unit 3021 and the second generating unit 3022 are only for illustrative purpose, rather than a limitation of the present invention. In other embodiments, the first generating unit 3021 and the second generating unit 3022 can be implemented by other logic gates as long as they can achieve the same goal as the embodiment of FIG. 3.

Figure 4:
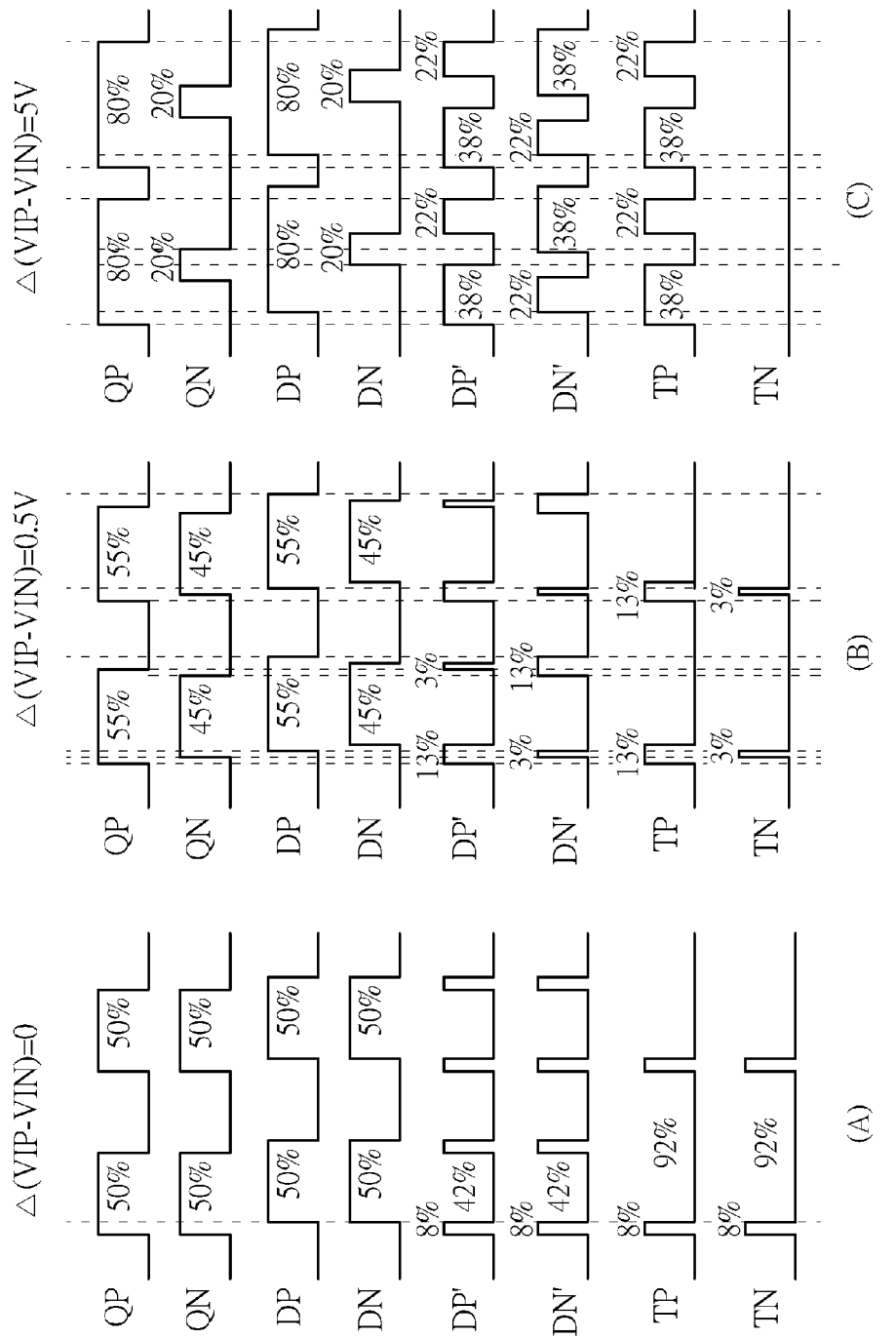
FIG. 4 is a diagram illustrating the waveform of a ternary signal according to an embodiment of the present invention.

FIG. 4 is a diagram illustrating the waveform of a ternary signal according to the ternary signal generating circuit 220 shown in FIG. 3. As shown in the sub-diagram (A) of FIG. 4, when a difference in amplitude between the complementary analog input signals of the audio amplifier 100 or a difference in amplitude between the complementary analog input signals VIP and VIN of the quaternary/ternary modulation selecting circuit 101 is within a predetermined range of zero amplitude (i.e. ±1% of zero amplitude), the positive quaternary wave QP and the negative quaternary wave QN are two square waves with the same duty cycle (i.e. 50% shown in FIG. 4). The waveform of the delay signals DP and DN are slightly delayed from the positive quaternary wave QP and the negative quaternary wave QN, respectively. In this embodiment, since the amplitude in the analog input signal VIP (i.e. 0V) is equal to that in the analog input signal VIN (i.e. 0V), the phase difference between the delayed signal DP and the positive quaternary wave QP is about 28.8 degrees. Therefore, the positive ternary wave TP has pulses with 8% duty cycles as shown in the sub-diagram (A) of FIG. 4. Similarly, the negative ternary wave TN also has pulse with 8% duty cycles which are identical to the pulses of the positive ternary wave TP. In this way, the differential output signals of the amplifier 100 approaches the predetermined range of zero amplitude if the gain (VOUTP−VOUN)/(VIP−VIN) is set to be one. Since the pulse width of the signal TP is equal to that of the signal TN, it can effectively solve the power loss and distortion issue mentioned in the prior art. It should be noted that the amount of delay of the delayed signals DP and DN in this embodiment is only for illustrative purpose, and not a limitation of the present invention. In practice, the particular delay of the delayed signals DP and DN depends on the ability of circuitry. The sub-diagram (B) of FIG. 4 illustrates the waveform of a ternary signal when the complementary analog input signals of the amplifier 100 is slightly enhanced, i.e. when a difference in amplitude between the complementary analog input signals of the audio amplifier 100 or a difference in amplitude between the complementary analog input signals VIP and VIN of the quaternary/ternary modulation selecting circuit 101 is not within the predetermined range of zero amplitude. As shown in the sub-diagram (B) of FIG. 4, when the difference in amplitude between the complementary analog input signals VIP and VIN is slightly increased to be 0.5V, the duty cycle of the positive ternary wave TP increases accordingly (e.g. 13% shown in FIG. 4), and the duty cycle of the negative ternary wave TN decreases accordingly (e.g. 3% shown in FIG. 4). The sub-diagram (C) of FIG. 4 illustrates the waveform of the ternary signal when the difference in amplitude between the complementary analog input signals VIP and VIN continues to increase to be 3V. The amplifier 100 operates in the normal ternary mode in which only one of the positive ternary wave TP and the negative ternary wave TN has a signal (e.g. the positive ternary wave TP illustrated in this embodiment).

Figure 5:
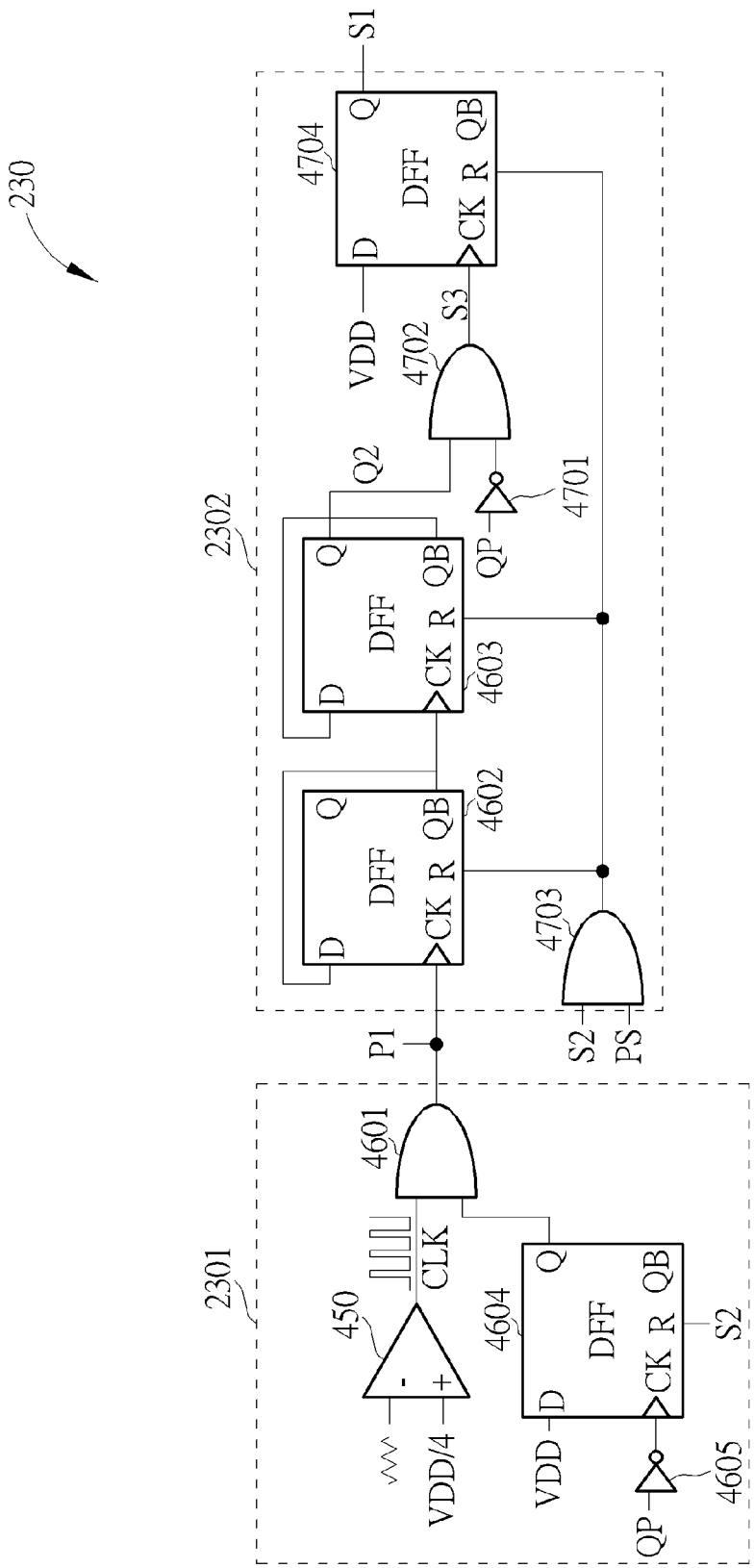
FIG. 5 is a diagram illustrating the architecture of a pulse generating circuit according to an embodiment of the present invention.

FIG. 5 is a diagram illustrating the architecture of a pulse generating circuit 230 according to an embodiment of the present invention. As shown in FIG. 5, the fixed duty pulse generator 2301 of the pulse generating circuit 230 comprises a comparator 450 for comparing the triangular wave with a quarter of the supply voltage VDD, i.e. VDD/4, to generate a clock signal CLK with a 25% duty cycle, an AND gate 4601, a D flip-flop 4604 and an inverter 4605, wherein the inputs of the AND gate 4601 are coupled to an output of the D flip-flop 4604 and the clock signal CLK with 25% duty cycle, the AND gate 4601 generates the signal P1 at an output terminal, and the D flip-flop 4604 serves as a latch to transmit the supply voltage VDD to one of the inputs of the AND gate 4601 and receives an inverted positive quaternary wave as a trigger as shown in FIG. 5. The counting circuit 2302 of the pulse generating circuit 230 comprises two counters 4602 and 4063, an inverter 4701, two AND gates 4702 and 4703, a D flip-flop 4704, wherein counters 4602 and 4603 for generating a signal Q2 are implemented by D flip-flops and coupled between the output of the AND gate 4601 and one of the input of the AND gate 4702, and the other input of the AND gate 4702 is coupled to an output of the inverter 4701 arranged for inverting the positive quaternary wave QP, and the D flip-flop 4704 serves as a latch to receive a signal S3 generated by the AND gate 4702 to generate a signal S1 to the first selecting circuit 240. In addition, the inputs of the AND gate 4703 are coupled to the signal S2 and a power signal PS, and an output of the AND gate 4703 is coupled to the reset terminals of the D flip-flops 4602, 4603 and 4704 for resetting these D flip-flops.

When the audio amplifier 100 starts up at power on, the power up signal PS goes high. When the audio amplifier 100 goes into quaternary modulation from ternary modulation, the signal S2 goes high. When one of the signals PS and S2 goes high, the D flip-flops 4602, 4603, 4604 and 4704 are reset and the signal S1 first becomes logic value '0'. Next, the clock signal CLK with 25% duty cycle is transferred to the output of the AND gate 4601 (i.e. the signal P1) and enters the counters 4602 and 4603 and the first selecting circuit 240, respectively. Due to the signal S1 still being logic value '0', the first selecting unit 480 and the second selecting unit 490 output the signal P1 to the output stage 230. After two pulses with 25% duty cycle are outputted and received by the counters 4602 and 4603, the signal Q2 which is logic value '1' is generated according to the characteristic of the counters implemented by D flip-flops, and the signal S1 outputted by the D flip-flop 4704 thus becomes logic value '1'. Therefore, the quaternary signal is outputted by the first selecting circuit 240 and the second selecting circuit 250, and the audio amplifier 100 enters the quaternary modulation mode thereafter. The audio amplifier 100 outputs two pulses with 25% duty cycle before the quaternary signal when the audio amplifier 100 starts up or goes into quaternary modulation from ternary modulation. Therefore, the over-current can be effectively suppressed.

Figure 6:
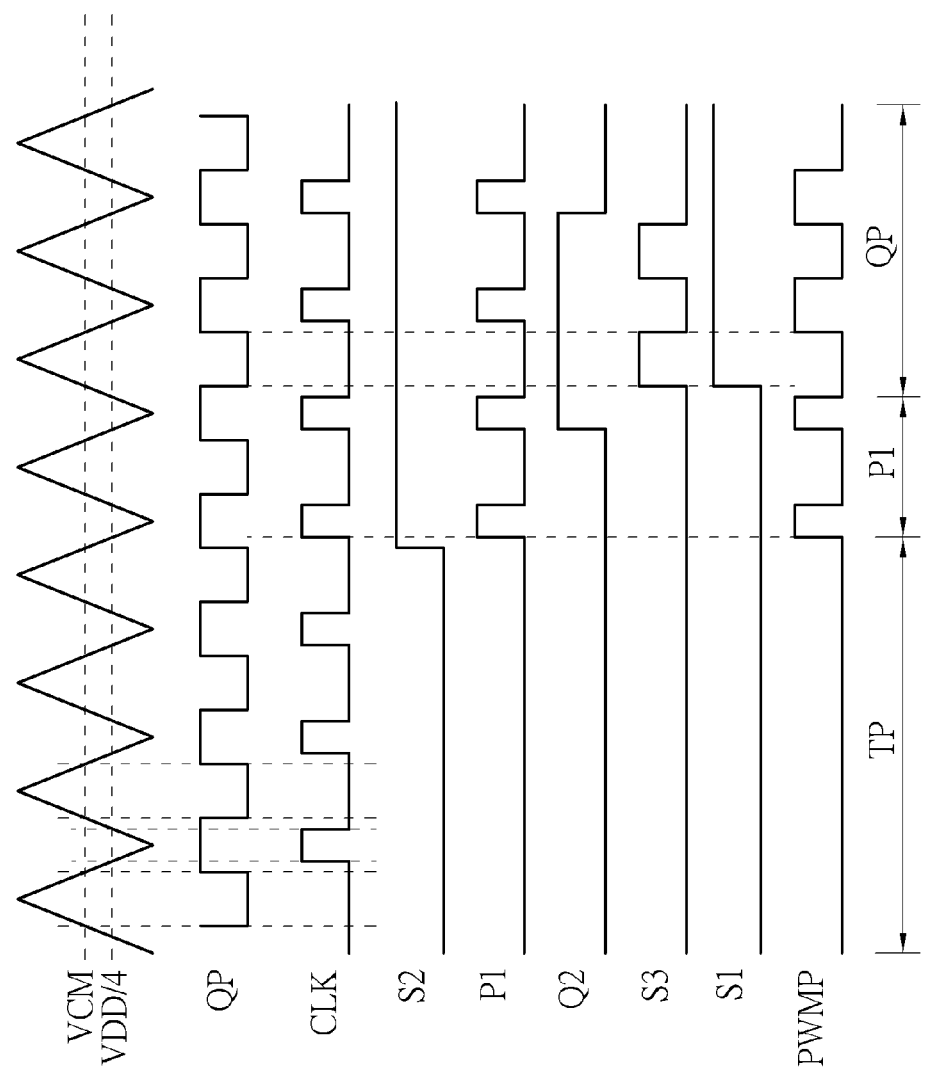
FIG. 6 is a timing diagram illustrating a pulse generating circuit of the quaternary/ternary modulation selecting circuit generating two pulses with a 25% duty cycle according to an embodiment of the present invention.

FIG. 6 is a timing diagram illustrating a pulse generating circuit 230 of the quaternary/ternary modulation selecting circuit 101 generating two pulses with 25% duty cycles according to an embodiment of the present invention. As shown in FIG. 6, if the signal S2 goes high, the signal P1 becomes the clock signal CLK with 25% duty cycle and is transferred by the first selecting circuit 240 and the second selecting circuit 250 to the output stage 130. The signal Q2 generated by the counters 4602 and 4603 goes high after two pulses with 25% duty cycle are received by the counters 4602 and 4603, and the signal S1 thus goes high and is transferred to the first selecting circuit 240. The quaternary signal will therefore be transferred to the output stage 130 instead. The audio amplifier 200 operates in quaternary modulation mode thereafter.

Figure 7:
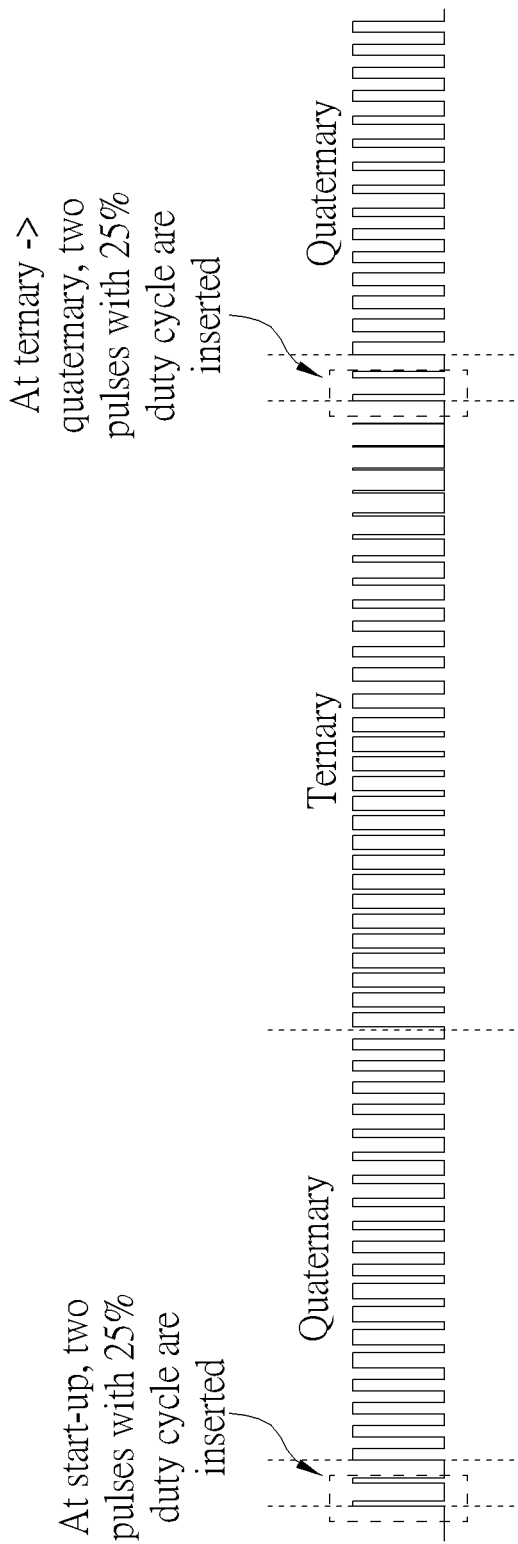
FIG. 7 is a diagram illustrating the signal outputted by the quaternary/ternary modulation selecting circuit after inserting two pulses with a 25% duty cycle according to an embodiment of the present invention.

FIG. 7 is a diagram illustrating the signal outputted by the quaternary/ternary modulation selecting circuit 101 after inserting two pulses with 25% duty cycles according to an embodiment of the present invention. According to the embodiments of FIG. 5 and FIG. 6, FIG. 7 illustrates the signal outputted by the quaternary/ternary modulation selecting circuit 101. As shown in FIG. 7, two pulses with 25% duty cycle are inserted when the audio amplifier 100 starts up and goes into quaternary modulation mode from ternary modulation mode to suppress the over-current accordingly.

Figure 8:
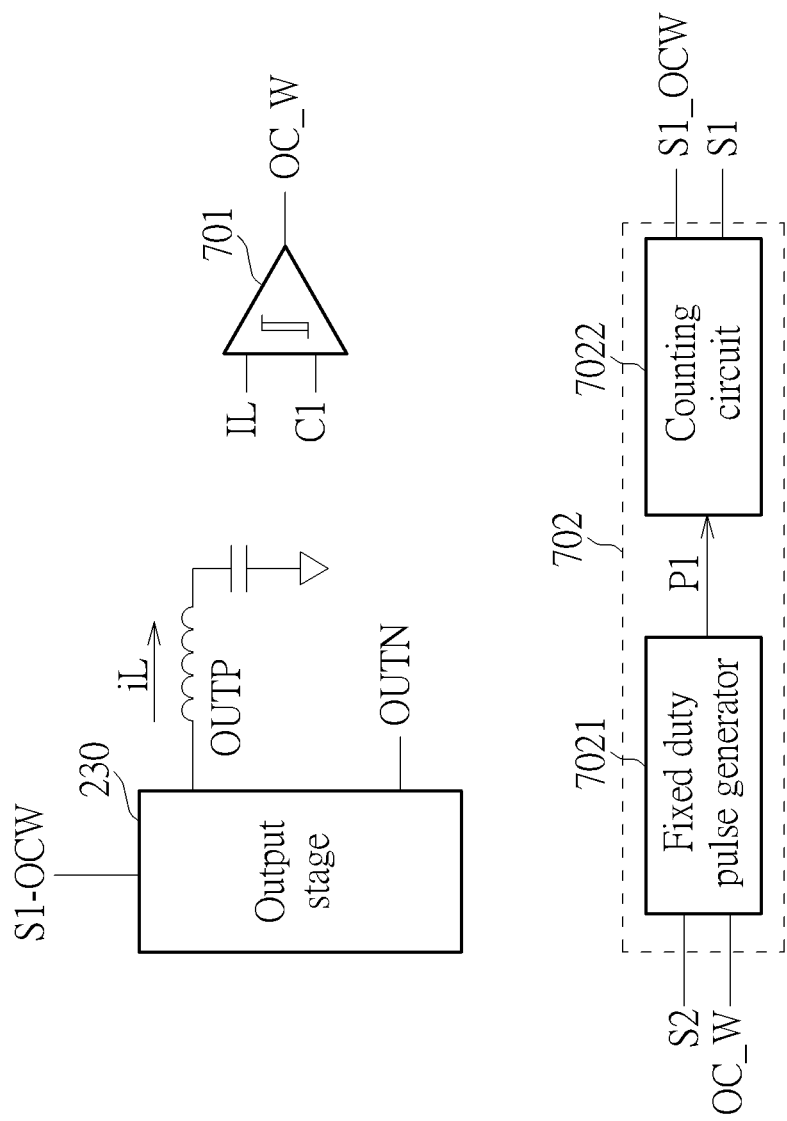
FIG. 8 is a diagram illustrating a detecting circuit and a pulse generating circuit according to another embodiment of the present invention.

In another embodiment of the present invention, the pulses with limited duty cycles (e.g., 25%) are not only inserted when the audio amplifier 100 starts up or goes into quaternary modulation from ternary modulation, but also immediately after inrush current occurs. FIG. 8 is a diagram illustrating a detecting circuit 701 and a pulse generating circuit 702 according to another embodiment of the present invention. In this embodiment, based on the architecture of the quaternary/ternary modulation selecting circuit depicted in FIG. 2, the detecting circuit 701 and the revised pulse generating circuit 702 are added for detecting inrush current at any moment, wherein the detecting circuit 701 is implemented by a comparator and arranged for comparing the loading current IL outputted by the output stage 203 with a predetermined current C1. If the loading current IL is stronger than the predetermined current C1, i.e. the over-current event occurs, the detecting circuit 701 generates a signal OC_W to the pulse generating circuit 702. After receiving the signal OC_W, the pulse generating circuit generates a plurality of pulses whose duty cycles are around 25% to the output stage to suppress the inrush current. In this embodiment, the plurality of pulses with limited duty cycles are eight pulses with 25% duty cycle, but this is not a limitation of the present invention. If the inrush current still exists after eight pulses with 25% duty cycle are outputted and received by the counting circuit 7022, a signal S1_OCW is generated to the output stage to shut down the output stage to prevent damage to the audio amplifier 100.

Figure 9:
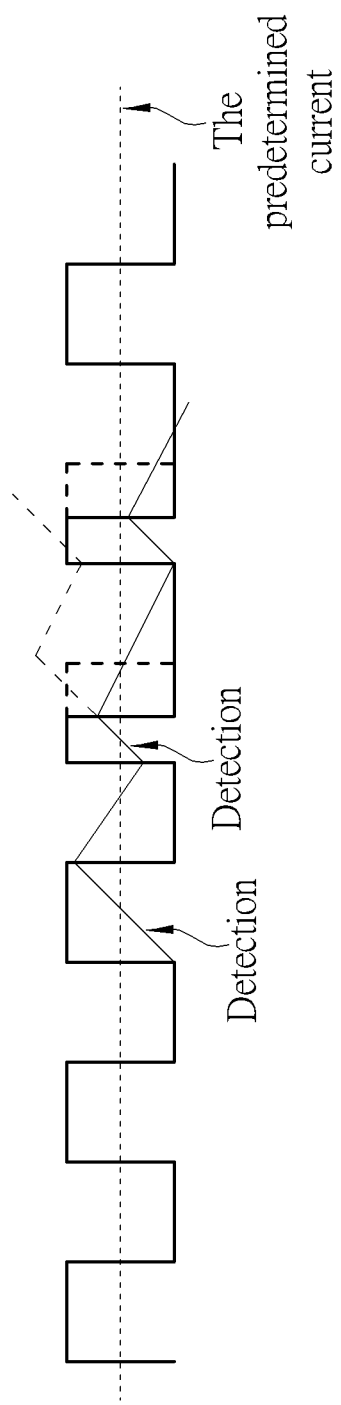
FIG. 9 is a timing diagram illustrating the over-current being suppressed by a plurality of pulses with duty cycle around 25% after over-current is detected according to an embodiment of the present invention.

FIG. 9 is a timing diagram illustrating the over-current being suppressed by a plurality of pulses with duty cycle of around 25% after an over-current is detected (e.g. the output current of the audio amplifier 200 is larger than a predetermined value) according to an embodiment of the present invention. As shown in FIG. 8, with the detecting circuit 701, the inrush current can be suppressed at any moment rather than allowing it to continue to increase which may cause damage to the audio amplifier 100.

In the embodiments of FIG. 5 to FIG. 9, the number of inserted pulses and the duty cycle of the inserted pulses are not limited, and can be more than two pulses depending on how many counters are used in the counting circuits 2302 and 7022. As long as the triangular wave is compared with a different voltage value, the different duty cycle can be obtained easily. Any alternative design which can generate a plurality of pulses whose duty cycles are around 25% to suppress the inrush current should fall within the scope of the present invention. Likewise, the architecture of the ternary signal generating circuit 220 is not limited to that described above, as long as the architecture can generate the positive ternary wave TP and the negative ternary wave TN as depicted in FIG. 4. In addition, the architecture of the pulse generating circuit 230 in FIG. 5 is only an example, and not a limitation of the present invention. As long as the signal S1 and the signal P1 can be generated as described above, these alternative designs should fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A quaternary/ternary modulation selecting circuit of an audio amplifier, comprising:
a quaternary signal generating circuit, for receiving complementary analog input signals to generate complementary quaternary signals; and
a ternary signal generating circuit, for generating a ternary signal according to the complementary quaternary signals, wherein the ternary signal comprises a positive ternary wave and a negative ternary wave;
wherein when a difference in amplitude between the complementary analog input signals is within a predetermined range of zero amplitude, a phase of the positive ternary wave generated from the ternary signal generating circuit is identical to a phase of the negative ternary wave generated from the ternary signal generating circuit.

2. The quaternary/ternary modulation selecting circuit of an audio amplifier of claim 1, wherein when the difference in amplitude between the complementary analog input signals is not within the predetermined range of zero amplitude, a duty cycle of one of the positive ternary wave and the negative ternary wave is greater than a duty cycle of the other of the positive ternary wave and the negative ternary wave.

3. The quaternary/ternary modulation selecting circuit of an audio amplifier of claim 1, wherein the ternary signal generating circuit comprises:
a delay circuit, arranged to delay the quaternary signal to generate a delayed signal; and
a generating unit, arranged to generate the ternary signal according to the delayed signal and the quaternary signal.

4. The quaternary/ternary modulation selecting circuit of an audio amplifier of claim 3, wherein the quaternary signal comprises a positive quaternary wave and a negative quaternary wave, and the delayed signal comprises a positive delayed wave and a negative delayed wave generated by delaying the positive quaternary wave and the negative quaternary wave, respectively, and the generating unit comprises:
a first generating unit, arranged to generate the positive ternary wave according to the positive quaternary wave and the negative delayed wave; and
a second generating unit, arranged to generate the negative ternary wave according to the negative quaternary wave and the positive delayed wave.

5. The quaternary/ternary modulation selecting circuit of an audio amplifier of claim 1, further comprising:
a pulse generating circuit, arranged to generate a plurality of pulses with limited duty cycles; and
a selecting circuit, arranged to select one of the quaternary signal, the ternary signal and the plurality of pulses for an output stage of the audio amplifier.

6. The quaternary/ternary modulation selecting circuit of an audio amplifier of claim 5, wherein when the audio amplifier starts up, the selecting unit outputs at least one of the pulses to the output stage of the audio amplifier.

7. The quaternary/ternary modulation selecting circuit of an audio amplifier of claim 5, wherein when an output current of the audio amplifier is larger than a predetermined current, the selecting unit outputs at least one of the pulses to the output stage of the audio amplifier.

8. The quaternary/ternary modulation selecting circuit of an audio amplifier of claim 5, wherein the selecting unit comprises:
a first selecting circuit for selectively outputting either the plurality of pulses or the quaternary signal according to a first selecting signal;
a second selecting circuit for selectively outputting either the ternary signal or an output of the first selecting circuit to the output stage according to a second selecting signal.

9. The quaternary/ternary modulation selecting circuit of an audio amplifier of claim 8, wherein the pulse generating circuit comprises:
a first comparator for comparing a triangular wave with a voltage source to generate the plurality of pulses;
a counting unit, coupled to the first comparator, wherein when the selecting unit starts to output the pulses to the output stage, the counter counts a number of pulses that has been outputted by the selecting unit; and
a control circuit, coupled to the counting unit, for generating the first selection signal to the first selecting circuit to stop outputting the pulses when the number of pulses that has been outputted by the selecting unit exceeds a predetermined number.

10. The quaternary/ternary modulation selecting circuit of an audio amplifier of claim 5, wherein the limited duty cycles are around 25%.

11. A quaternary/ternary modulation selecting method of an audio amplifier, comprising:
receiving complementary analog input signals to generate complementary quaternary signals; and
generating a ternary signal according to the complementary quaternary signals, wherein the ternary signal comprises a positive ternary wave and a negative ternary wave;
wherein when a difference in amplitude between the complementary analog input signals is within a predetermined range of zero amplitude, a phase of the positive ternary wave is identical to a phase of the negative ternary wave.

12. The quaternary/ternary modulation selecting method of claim 11, wherein when the difference in amplitude between the complementary analog input signals is not within the predetermined range of zero amplitude, a duty cycle of one of the positive ternary wave and the negative ternary wave is greater than a duty cycle of the other of the positive ternary wave and the negative ternary wave.

13. The quaternary/ternary modulation selecting method of claim 11, wherein the step of generating the ternary signal comprises:
   delaying the quaternary signal to generate a delayed signal; and
   generating the ternary signal according to the delayed signal and the quaternary signal.

14. The quaternary/ternary modulation selecting method of claim 13, wherein the quaternary signal comprises a positive quaternary wave and a negative quaternary wave, and the delayed signal comprises a positive delayed wave and a negative delayed wave generated by delaying the positive quaternary wave and the negative quaternary wave, respectively, and the method further comprises:
   generating the positive ternary wave according to the positive quaternary wave and the negative delayed wave; and
   generating the negative ternary wave according to the negative quaternary wave and the positive delayed wave.

15. The quaternary/ternary modulation selecting method of claim 11, further comprising:
   generating a plurality of pulses with limited duty cycles; and
   selecting one of the quaternary signal, the ternary signal and the plurality of pulses for an output stage of the audio amplifier.

16. The quaternary/ternary modulation selecting method of claim 15, further comprising:
   when the audio amplifier starts up, outputting at least one of the pulses to the output stage of the audio amplifier.

17. The quaternary/ternary modulation selecting method of claim 15, further comprising:
   when an output current of the audio amplifier is larger than a predetermined current, outputting at least one of the pulses to the output stage of the audio amplifier.

18. The quaternary/ternary modulation selecting method of claim 15, wherein the step of selecting one of the quaternary signal, the ternary signal and the plurality of pulses for the output stage of the audio amplifier comprises:
   selectively outputting either the plurality of pulses or the quaternary signal according to a first selecting signal; and
   selectively outputting either the ternary signal or an output of the first selecting circuit to the output stage according to a second selecting signal.

19. The quaternary/ternary modulation selecting method of claim 18, further comprising:
   comparing a triangular wave with a voltage source to generate the plurality of pulses;
   when starting to output the pulses to the output stage, counting a number of pulses that has been outputted to the output stage; and
   generating the first selection signal to the first selecting circuit to stop outputting the pulses when the number of pulses that has been outputted to the output stage exceeds a predetermined number.

20. The quaternary/ternary modulation selecting method of claim 15, wherein the limited duty cycles are around 25%.

* * * * *